United States Patent
Bjorndahl et al.

[11] Patent Number: 6,005,771
[45] Date of Patent: Dec. 21, 1999

[54] ELECTRONICS COOLING TECHNIQUE FOR SPACECRAFT MODULES

[75] Inventors: William D. Bjorndahl; Paul T. Tsutsumi; Ramon Coronel, all of Torrance; Janice W. Espinosa, Long Beach, all of Calif.

[73] Assignee: TRW Inc., Redondo Beach, Calif.

[21] Appl. No.: 08/771,085

[22] Filed: Dec. 20, 1996

[51] Int. Cl.⁶ .................................................. H05K 7/20
[52] U.S. Cl. ........................... 361/699; 361/689; 361/704; 361/709; 361/710; 165/80.3; 165/185; 257/714
[58] Field of Search ..................................... 361/699, 704, 361/709, 710, 689, 708; 165/80.3, 185; 257/714

[56] References Cited

U.S. PATENT DOCUMENTS

| | | | |
|---|---|---|---|
| 4,341,432 | 7/1982 | Cutchaw | 174/16.3 |
| 5,001,548 | 3/1991 | Iversen | 257/714 |
| 5,050,040 | 9/1991 | Gondusky et al. | 361/708 |
| 5,323,292 | 6/1994 | Brzezinski | 361/689 |
| 5,424,919 | 6/1995 | Hielbrunner | 361/710 |
| 5,549,155 | 8/1996 | Meyer, IV et al. | 361/710 |
| 5,661,902 | 9/1997 | Katchmar | 361/719 |

*Primary Examiner*—Leo P. Picard
*Assistant Examiner*—Boris L. Chervinsky
*Attorney, Agent, or Firm*—Michael S. Yatsko

[57] ABSTRACT

A spacecraft avionics module in which integrated circuit chip packages or chips are mounted in direct contact with the surface of a radiator panel, to enhance dissipation of heat from the integrated circuit and to allow electronics to be packed more densely while still dissipating sufficient heat to allow the electronics to operate at a desirable temperature. Conduction of heat from the electronics to the radiator panel is further enhanced by the use of a thermally conductive adhesive disposed between the integrated circuit chip packages or chips and the radiator panel, which may include heatpipes for more uniform heat distribution across the panel.

6 Claims, 2 Drawing Sheets

ELECTRONICS COOLING TECHNIQUE FOR SPACECRAFT MODULES

BACKGROUND OF THE INVENTION

This invention relates generally to electronics packaging and cooling techniques and, more particularly, to techniques for cooling integrated circuits in a space environment. There is a trend in the design of electronics for spacecraft toward more densely packed circuits, both at a component level and a chip level. This leads to an increase in power density and a high heat dissipation requirement. Cooling in a space environment must rely on conduction and radiation of heat from the packages, so many of the normal packaging techniques employing natural or forced convection do not work. In the past, spacecraft have simply used lower power densities. Complicated systems using pumped coolant have been proposed, but additional difficulties are likely to be introduced whenever anything other than passive cooling is used. Accordingly, there is still a need for a simpler solution to the cooling problems associated with high power density electronics in spacecraft. The present invention satisfies this need.

SUMMARY OF THE INVENTION

The present invention resides in an electronics packaging structure for efficient cooling of spacecraft electronics equipment modules. Briefly, and in general terms, the structure of the invention comprises a radiator panel; at least one circuit board mounted on the radiator panel; at least one integrated circuit chip package mounted on the circuit board; and a radiation shield mounted on the panel to cover the circuit board and the integrated circuit chip package. The integrated circuit chip package is positioned in close contact with a surface of the radiator panel, such that heat is dissipated from the integrated circuit chip package by direct conduction to the radiator panel and thence by radiation into space.

The structure may further comprise a quantity of thermally conductive adhesive positioned between the integrated circuit chip package and the radiator panel surface, to enhance conduction of heat to the radiator panel. The structure may additionally comprise at least one heat-conducting pipe attached to the radiator panel on a surface opposite the surface with which the integrated circuit chip package is in contact, the heat-conducting pipe serving to distribute heat more uniformly across the radiator panel. A quantity of thermally conductive adhesive may be positioned between the heat-conducting pipe and the radiator panel, to further enhance conduction of heat into the heat-conducting pipe.

In one disclosed embodiment of the invention, the structure includes multiple integrated circuit chip packages and a circuit board installed immediately adjacent to the radiation panel. The circuit board adjacent to the radiation panel has openings in which at least some of the integrated circuit chip packages are positioned, in contact with the radiator panel. This embodiment of the invention may also include a quantity of thermally conductive adhesive positioned between the integrated circuit chip packages and the radiator panel surface, to enhance conduction of heat to the radiator panel. At least one heat-conducting pipe may be attached to the radiator panel on a surface opposite the surface with which the integrated circuit chip packages are in contact, and a quantity of thermally conductive adhesive positioned between the heat-conducting pipe and the radiator panel, to further enhance conduction of heat into the heat-conducting pipe.

It will be appreciated from the foregoing that the present invention represents a significant advance in the field of electronics packaging for spacecraft applications. In particular, the invention provides a cooling technique that allows spacecraft electronics to be packaged at greater power densities while still providing efficient passive cooling by radiation. Other aspects and advantages of the invention will become apparent from the following more detailed description, taken in conjunction with the accompanying drawings.

DESCRIPTION OF THE PREFERRED EMBODIMENT

Figure 1:
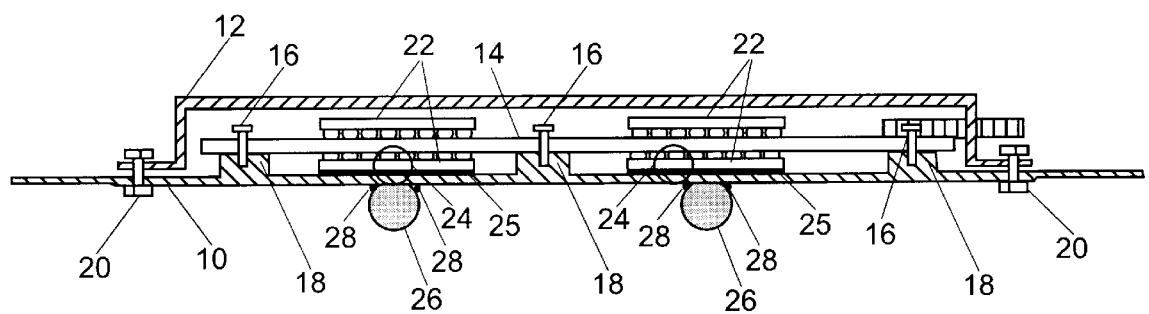
FIG. 1 is a cross-sectional view of an electronics package mounted on a spacecraft equipment module in accordance with the present invention.

As shown in the drawings for purposes of illustration, the present invention pertains to an electronics packaging and cooling technique ideally suited for cooling high power density electronics on spacecraft equipment modules. In the past, spacecraft electronics packages have had a relatively low power density and have typically been coupled to heat radiator panels through heat-conducting pipes, often over quite long distances.

In accordance with the present invention, integrated circuit chip packages are mounted in direct contact with a conductive panel that serves as a heat radiator. FIG. 1 shows a portion of a radiator panel 10, which has locally thickened regions for attachment of a radiation shield 12. The panel 10 and radiation shield 12 may be conveniently machined from aluminum, for example. A circuit board 14 is suspended between the panel 10 and the radiation shield 12. The circuit board 14 is conventionally mounted by fasteners 16 on raised standoffs or posts 18 integral with the panel 10. Other fasteners 20 are used to secure the radiation shield 12 to the panel 10. Integrated circuit chips and/or chip packages 22 are mounted above and beneath the circuit board 14. The integrated circuit packages may be of the ball grid array (BGA) type, but the principle of the invention applies to any type of chip package. A critical aspect of the invention is that the chips and/or chip packages 22 are mounted in close contact with the panel 10, as indicated by the circles 24. Ideally, this close contact is enhanced with the addition of a thermally conductive adhesive material between the chip or package 22 and the surface of the panel 10, as indicated by the dark thickened line 25 at this interface. Preferably, the chips or packages 22 are positioned directly over heatpipes 26 located on the opposite face of the panel 10. Heatpipes are conventionally soldered to radiator panels to distribute heat more uniformly across the panels. For enhanced cooling effect, a thermally conductive adhesive may also be placed in the regions between the heatpipes 26 and the panel 10, as indicated at 28.

Figure 2:
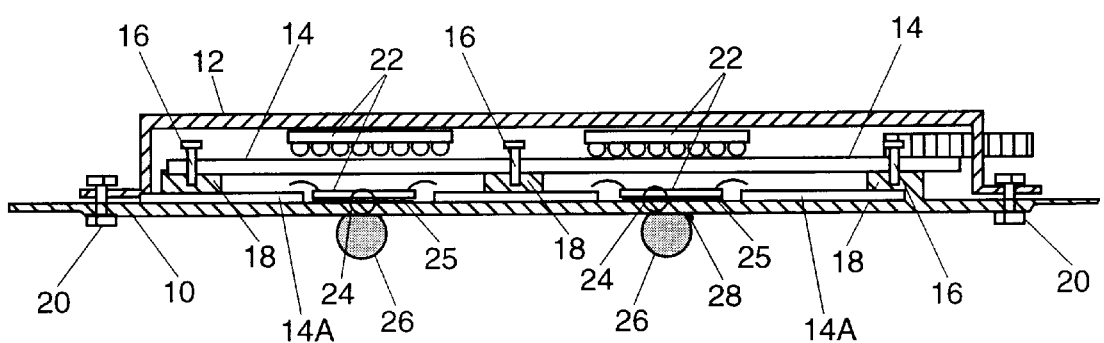
FIG. 2 is a cross-sectional view similar to FIG. 1, but depicting a different packaging configuration using a double-decker panel.

The embodiment shown in FIG. 2 differs from the one shown in FIG. 1 only in that there is an additional circuit board adjacent to the panel 10, as indicated at 14A. This lower circuit board has cutouts to accommodate direct chip attach packages 22 to the panel 10. Again, it is preferable to use a thermally conductive adhesive between the chips 22 and the surface of the panel 10, and between the panel and the heatpipes 26.

It will be appreciated from the foregoing that the present invention represents a significant advance in the field of electronics packaging for a space environment. In particular, the invention provides for direct contact between chip packages, direct attached chips, and a heat dissipating panel, thereby increasing the rate at which heat can be dissipated from densely packaged electronics modules. It will also be appreciated that, although an embodiment of the invention has been described in detail for purposes of illustration, various modifications may be made without departing from the spirit and scope of the invention. Accordingly, the invention should not be limited except as by the appended claims.

What is claimed is:

1. An electronics packaging structure for efficient cooling of spacecraft electronics equipment modules, comprising:

a radiator panel;

at least one circuit board rigidly mounted on the radiator panel in a generally parallel relationship thereto;

a plurality of integrated circuit chip packages mounted on the circuit board; and a radiation shield rigidly mounted on the radiator panel to cover the entire circuit board and the integrated circuit chip packages;

wherein the integrated circuit chip packages are positioned in close contact with a surface of the radiator panel, such that heat is dissipated from the integrated circuit chip packages by direct conduction to the radiator panel and hence by radiation into space.

2. An electronics packaging structure as defined in claim 1, and further comprising:

a quantity of thermally conductive adhesive positioned between each integrated circuit chip package and the radiator panel surface, to enhance conduction of heat to the radiator panel.

3. An electronics packaging structure as defined in claim 2, and further comprising:

at least one heat-conducting pipe attached to the radiator panel on a surface opposite the surface with which the integrated circuit chip packages are in contact, the heat-conducting pipe serving to distribute heat more uniformly across the radiator panel; and a quantity of thermally conductive adhesive positioned between the heat-conducting pipe and the radiator panel, to further enhance conduction of heat into the heat-conducting pipe.

4. An electronics packaging structure as defined in claim 1, wherein:

the structure includes a circuit board installed immediately adjacent to the radiation panel; and the circuit board adjacent to the radiation panel has openings in which at least some of the integrated circuit chip packages are positioned, in contact with the radiator panel.

5. An electronics packaging structure as defined in claim 4, and further comprising:

a quantity of thermally conductive adhesive positioned between each of the integrated circuit chip packages and the radiator panel surface, to enhance conduction of heat to the radiator panel.

6. An electronics packaging structure as defined in claim 5, and further comprising:

at least one heat-conducting pipe attached to the radiator panel on a surface opposite the surface with which the integrated circuit chip packages are in contact, the heat-conducting pipe serving to distribute heat more uniformly across the radiator panel; and a quantity of thermally conductive adhesive positioned between the heat-conducting pipe and the radiator panel, to further enhance conduction of heat into the heat-conducting pipe.

* * * * *